United States Patent [19]

Ochi et al.

[11] 4,118,640
[45] Oct. 3, 1978

[54] JFET BASE JUNCTION TRANSISTOR CLAMP

[75] Inventors: Sam S. Ochi, San Jose; Adib R. Hamade, Cupertino; Daniel D. Culmer, Sunnyvale, all of Calif.

[73] Assignee: National Semiconductor Corporation, Santa Clara, Calif.

[21] Appl. No.: 735,879

[22] Filed: Oct. 22, 1976

[51] Int. Cl.² ............................................. H03K 5/08
[52] U.S. Cl. ................................. 307/237; 307/280; 307/300; 307/304
[58] Field of Search ................ 307/237, 280, 300, 304

[56] References Cited

U.S. PATENT DOCUMENTS

| 3,160,765 | 12/1964 | Krossa | 307/300 X |
|---|---|---|---|
| 3,482,111 | 12/1969 | Gunderson et al. | 307/300 X |
| 3,534,281 | 10/1970 | Hillhouse | 307/300 X |
| 3,621,284 | 11/1971 | Cluett et al. | 307/237 |
| 3,657,577 | 4/1972 | Wakai et al. | 307/300 X |
| 3,665,345 | 5/1972 | Dolby | 307/237 X |
| 3,763,382 | 10/1973 | Horichi et al. | 307/237 X |
| 3,845,405 | 10/1974 | Leidrich | 307/300 X |
| 4,013,975 | 3/1977 | Kataoka et al. | 307/237 X |

OTHER PUBLICATIONS

Hong et al., "Nonsaturating Logic Circuit", *IBM Tech. Discl. Bull.,* vol. 14, No. 5, pp. 1592, 10/1971.

*Primary Examiner*—Larry N. Anagnos
*Attorney, Agent, or Firm*—Gail W. Woodward

[57] ABSTRACT

A base junction transistor inverter circuit will be driven into the saturation region if the drive current is large enough. In such circumstances, the collector voltage can go below the base voltage and approaches the emitter voltage. A circuit is provided to keep the transistor out of saturation and is comprised of a p-channel field effect transistor (JFET) connected between the base and collector of the junction transistor. The JFET is connected such that when the drive current increases and the junction transistor approaches saturation, the drive current is diverted through the JFET and into the substrate. The same clamp can be implemented by using a pnp junction transistor in combination with an n-channel JFET.

1 Claim, 3 Drawing Figures

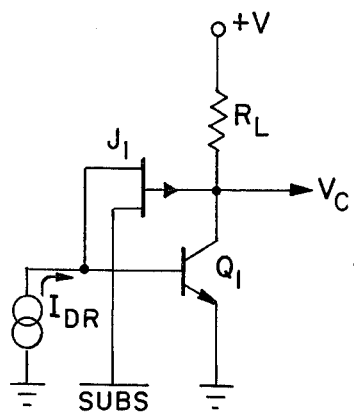
Fig_1
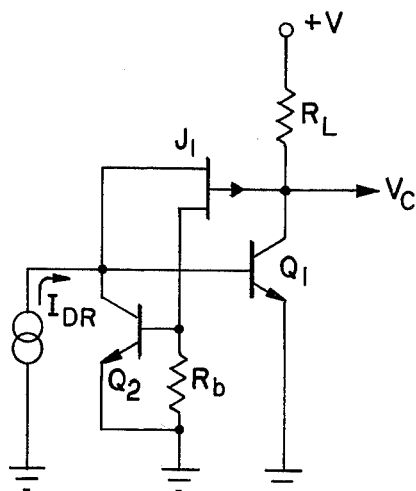
Fig_2
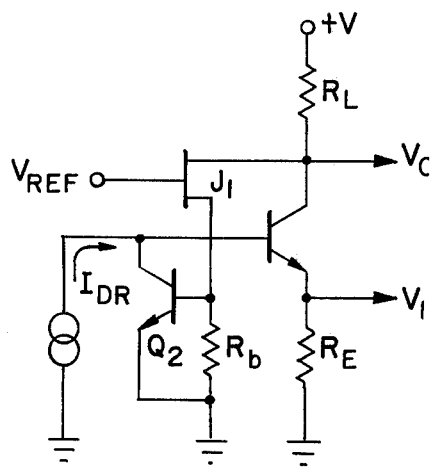
Fig_3

JFET BASE JUNCTION TRANSISTOR CLAMP

BACKGROUND OF THE INVENTION

The present invention relates in general to monolithic transistor circuit technology and, more particularly, to transistor inverter circuits employing bipolar transistors and field effect transistors.

DESCRIPTION OF THE PRIOR ART

Prior to the invention described herein, Schottky clamping diodes were utilized which were leaky, resulted in more collector to base capacitance, required extra monolithic substrate area during manufacturing, and the breakdown potential of the clamped device was affected by the manufacturing process.

Another widely used prior art circuit is the Baker clamp. This clamp uses a first diode in series with the base of a transistor and a second diode between the input of the first diode and the collector of the transistor. More silicon area is used in fabrication and the collector swing is limited by the reverse breakdown voltage of the second diode.

SUMMARY OF THE PRESENT INVENTION

It is a primary object of the present invention to provide a clamping circuit which acts to keep a transistor out of its saturation region.

Briefly, the above objects are accomplished in accordance with the invention by fabricating a JFET transistor between the base and collector of a monolithic npn transistor. This is accomplished by adding a p-ion implant and an n-ion implant layer over the collector epitaxial region. The base of the npn transistor acts as the source, the isolation acts as the drain connected to the substrate, the ion implanted region acts as the channel, and the collector, and the n-ion implant acts as the gate surrounding the channel. The same process can be utilized to fabricate a pnp transistor with an n-channel JFET clamp.

The circuit has the advantage that the JFET transistor keeps the junction transistor out of saturation and prevents collector voltage from going below the base voltage.

The foregoing and other objects, features and advantages of the invention will be apparent from the following more particular description of the preferred embodiments of the invention as illustrated in the accompanying drawings.

BRIEF DESCRIPTION OF THE DRAWINGS

FIG. 1 is a schematic circuit diagram of a junction transistor inverter with a JFET clamp connected thereto, FIG. 2 is a schematic circuit diagram similar to that of FIG. 1, incorporating an additional junction transistor for handling large current drive; and FIG. 3 is a schematic circuit diagram of a third embodiment of the invention.

DESCRIPTION OF THE PREFERRED EMBODIMENT

Referring now to FIG. 1, an npn junction transistor Q1 is shown with a collector load RL returned to a positive supply voltage +V. A p-channel field effect transistor (JFET) J1 is connected with its source connected to the base of Q1 and its drain connected to the substrate. The gate of J1 is connected to the collector of Q1. Initially, when the base drive current Idr is low, the voltage at the gate of J1 is close to the supply voltage +V since Q1 is barely conducting. As Idr increases, Q1 starts conducting and the voltage Vc drops. As the voltage gets lower and approaches the base potential of Q1, J1 starts to turn on. J1 starts to conduct current when the base to collector potential of Q1 reaches $V_p$, the pinch off voltage of J1. As Idr continues to increase, J1 starts to conduct more and diverts current from Q1, which current is diverted to the substrate.

Thus, when the gate of J1 is $V_p$ or more above its source, that is the collector of Q1 is $V_p$ or more above its base, then J1 does not conduct. Under these circumstances, Idr supplies the base current of Q1 which operates in its linear region. As Idr is increased, the collector voltage decreases on Q1 and starts approaching the saturation voltage. As soon as the collector to base voltage becomes less than $V_p$, J1 starts conducting and tries to maintain the gate to source potential equal to or greater than zero, which keeps Q out of its saturated region.

When the collector voltage gets close to the base voltage, then most of the drive current flows through J1 into the substrate, assuming that J1 has been designed such that its Idss (source to drain current) is greater than Idr.

Referring now to FIG. 2, a second embodiment of the invention is shown. In the circuit of FIG. 2, an additional transistor Q2 is connected with its base electrode connected to the drain of J1. In this circuit, instead of just having the drain circuit of J1 subtracting from the Idr a ratio is obtained because of the current gain provided by Q2. This means that the clamping action is faster and therefore the limit is much sharper and will clamp at a much more precise potential. The collector of Q1 now clamps at a higher voltage level, which is a useful feature especially if the collector saturation voltage of Q1 is large. Also, J1 can now be made a smaller device for a given drive current Idr.

Referring now to FIG. 3, a third embodiment of the invention is shown. In this embodiment, the gate of J1 is connected to a reference voltage. This allows the clamping level to be varied. In this case, the maximum collector voltage Vc is equal to the reference voltage (Vref) minus the pinch-off voltage of J1. When this point is reached, the transistor J1 turns on and starts to divert the drive current through Q2.

While the invention has been particularly shown and described with reference to preferred embodiments thereof, it will be understood by those skilled in the art that various changes in form and details may be made therein without departing from the spirit and scope of the invention.

What is claimed is:

1. A base junction transistor clamp comprising:
   a first base-junction transistor to be clamped fabricated into a semiconductor substrate and having its emitter coupled to said substrate;
   a second-base juncton transistor having its collector connected to the base of said first base-junction transistor, its emitter connected to said substrate, and a base; and
   a field-effect transistor having its source connected to the collector of said first base-junction transistor, its drain connected to said base of said second base-junction transistor and its gate connected to a source of reference potential, thereby causing the potential at the collector of said first base-junction transistor to be clamped at a level established by said reference potential.

* * * * *